United States Patent
Tian et al.

(10) Patent No.: US 10,070,026 B2
(45) Date of Patent: Sep. 4, 2018

(54) GIMBAL

(71) Applicant: YUNEEC TECHNOLOGY CO., LIMITED, Hong Kong (CN)

(72) Inventors: Yu Tian, Jiangsu (CN); Wenyan Jiang, Jiangsu (CN)

(73) Assignee: YUNEEC TECHNOLOGY CO., LIMITED, Hong Kong (CN)

( * ) Notice: Subject to any disclaimer, the term of this patent is extended or adjusted under 35 U.S.C. 154(b) by 0 days.

(21) Appl. No.: 15/529,499

(22) PCT Filed: Dec. 15, 2015

(86) PCT No.: PCT/CN2015/097351
§ 371 (c)(1),
(2) Date: May 25, 2017

(87) PCT Pub. No.: WO2016/095792
PCT Pub. Date: Jun. 23, 2016

(65) Prior Publication Data
US 2017/0264796 A1 Sep. 14, 2017

(30) Foreign Application Priority Data
Dec. 15, 2014 (CN) .................... 2014 2 0795952 U

(51) Int. Cl.
H04N 5/225 (2006.01)
B64D 47/08 (2006.01)
G03B 17/56 (2006.01)
H05K 5/03 (2006.01)
H05K 7/14 (2006.01)
H05K 1/02 (2006.01)
H05K 5/00 (2006.01)
B64C 39/02 (2006.01)
H04B 7/04 (2017.01)
H04W 84/12 (2009.01)

(52) U.S. Cl.
CPC .......... H04N 5/2252 (2013.01); B64D 47/08 (2013.01); H05K 1/0203 (2013.01); H05K 5/0004 (2013.01); H05K 5/03 (2013.01); H05K 7/1427 (2013.01); B64C 39/024 (2013.01); B64C 2201/127 (2013.01); G03B 17/561 (2013.01); H04B 7/04 (2013.01); H04W 84/12 (2013.01); H05K 2201/066 (2013.01); H05K 2201/10098 (2013.01)

(58) Field of Classification Search
None
See application file for complete search history.

(56) References Cited

U.S. PATENT DOCUMENTS 5,184,521 A * 2/1993 Tyler ...................... G01C 21/18
248/324
9,952,485 B1 * 4/2018 Luski ................... G03B 17/561
(Continued)

Primary Examiner — WB Perkey

(57) ABSTRACT

A gimbal includes a housing (1). A gyroscope board (4), a camera (21), and a camera main control board (22) electrically connected with the camera are disposed in the housing. A Wi-Fi circuit board (31) and a Wi-Fi antenna (33) are also disposed in the housing. The Wi-Fi circuit board is electrically connected with the camera main control board. The camera is fixed on the housing. The gimbal achieves the independent Wi-Fi transmission, so that the structure is simplified.

20 Claims, 3 Drawing Sheets

(56) References Cited

U.S. PATENT DOCUMENTS

| | | | |
|---|---|---|---|
| 2013/0051782 A1* | 2/2013 | Dimotakis | G03B 15/006 396/428 |
| 2013/0277500 A1* | 10/2013 | Miller | F16F 15/02 244/131 |
| 2015/0053833 A1* | 2/2015 | St Louis | G03B 15/006 248/278.1 |
| 2016/0130015 A1* | 5/2016 | Caubel | B64C 27/001 244/120 |
| 2016/0291445 A1* | 10/2016 | Fisher, Sr. | G03B 15/006 |
| 2017/0113814 A1* | 4/2017 | Zhao | B64D 47/08 |
| 2017/0131621 A1* | 5/2017 | Tang | G03B 17/02 |
| 2017/0152060 A1* | 6/2017 | Morisawa | B64D 47/08 |
| 2017/0264796 A1* | 9/2017 | Tian | B64D 47/08 |
| 2017/0305574 A1* | 10/2017 | Tian | B64D 47/08 |
| 2018/0035020 A1* | 2/2018 | Pan | B64D 1/08 |
| 2018/0112980 A1* | 4/2018 | Diem | G01C 17/38 |

\* cited by examiner

GIMBAL

CROSS REFERENCE OF RELATED APPLICATION

This is a U.S. National Stage under 35 U.S.C. 371 of the International Application PCT/CN2015/097351, filed Dec. 15, 2015, which claims priority under 35 U.S.C. 119(a-d) to CN201420795952.2, filed Dec. 15, 2014. The full text of the above-mentioned Chinese patent application is included in the present invention.

BACKGROUND OF THE PRESENT INVENTION

Field of Invention

The present invention relates to a gimbal.

Description of Related Arts

With the development of society and industry by leaps and bounds, the UAV (Unmanned Aerial Vehicle) aerial photography has been applied to more and more fields, such as film and television shooting, fire patrol shooting and traffic monitoring. The synchronous transmission of the UAV aerial photography has important significances. However, the gimbal itself now on the market does not include a Wi-Fi (wireless fidelity) digital transmission system, and it is necessary for the gimbal to transmit through an external device. Moreover, the internal structure of the gimbal is complex, electronic components need to be connected with each other through wires, which results in the complex connections among the overall wires, thus it is prone to failure. In addition, because the camera itself rotates, the wires will be driven to move together, thus it is easy to failure due to worn wires.

SUMMARY OF THE PRESENT INVENTION

A technical problem to be resolved of the present invention is to provide a gimbal for overcoming drawbacks that the existing gimbals are unable to independently achieve the Wi-Fi digital transmission, and it is difficult to arrange electronic components due to complex internal wire connections.

The present invention resolves the above technical problem through a technical solution as follows.

A gimbal comprises a housing, wherein: a gyroscope board, a camera and a camera main control board electrically connected with the camera are disposed in the housing; a Wi-Fi (wireless fidelity) circuit board and Wi-Fi antennas are also disposed in the housing; the Wi-Fi circuit board is electrically connected with the camera main control board, the camera is fixed on the housing. While operating, the Wi-Fi circuit board is adapted for receiving video signals and transmitting the video signals to an exterior through the Wi-Fi antennas. The Wi-Fi circuit board always rotates with the housing for saving wires and avoiding wear and tear of the wires.

Preferably, the camera is fixed in the housing through a camera frame; through the camera frame, the camera is able to be firmly fixed in the housing.

Preferably, an amount of the Wi-Fi antennas is two; the two Wi-Fi antennas are respectively located at an upper side and a lower side of the housing for enhancing the signal strength and avoiding shielding of other frame structures while rotating the housing, thereby ensuring the stability of signals.

Preferably, the gimbal further comprises a heat sink which is attached to the Wi-Fi circuit board for effectively dissipating heat of the Wi-Fi circuit board.

Preferably, the housing comprises a front cover and a rear cover connected with the front cover through threaded components.

Preferably, the gimbal further comprises a second shaft arm, wherein: a first motor seat and a first bearing seat are respectively disposed at two sides of the rear cover, a first shaft motor is fixed to the first motor seat, a first bearing is fixed to the first bearing seat, a hollow shaft penetrates through the first bearing, the second shaft arm is respectively connected with the hollow shaft and the first shaft motor, such that the housing is able to rotate relatively to the second shaft arm for adjusting camera angles.

Preferably, the first motor seat and the first bearing seat are respectively covered with two end caps for sealing the housing, so as to avoid components in the housing being eroded.

Preferably, the gimbal further comprises a second shaft motor which is respectively connected with the second shaft arm and a third shaft arm, such that the second shaft arm is able to rotate relatively to the third shaft arm, so as to further drive the housing to rotate.

Preferably, the gimbal further comprises a third shaft seat, wherein the third shaft arm is fixed to the third shaft seat.

Preferably, the gimbal further comprises a third shaft motor which is respectively connected with the third shaft seat and a gimbal shock absorption plate, such that the third shaft seat is able to rotate relatively to the gimbal shock absorption plate, so as to further drive the housing to rotate.

Preferably, the gimbal further comprises gimbal fixed supports, wherein multiple shock absorption balls are disposed between the gimbal shock absorption plate and each of the gimbal fixed supports for reducing the vibration of the gimbal, so as to ensure the image quality of the camera.

Preferably, a gimbal receiver, a photoelectric encoder and a gimbal main control board are disposed in the third shaft seat; the third shaft seat is covered with a stuffy cover for sealing the third shaft seat, so as to ensure the sealing effect.

In the present invention, the above-described preferred conditions can be arbitrarily combined on the basis of common senses in the field to obtain the preferred embodiments of the present invention The positive effects of the present invention are that: in the present invention, the Wi-Fi circuit board is disposed in the housing, thus realizing the independent Wi-Fi transmission of the gimbal, simplifying the connections among the wires, reducing the failure due to the wear and tear of the wires, and decreasing the failure rate.

Descriptions of drawing reference numbers are as follows.

1: housing; 11: front cover; 12: rear cover; 13: end cap; 14: end cap; 21: camera; 22: camera main control board; 23: camera frame; 31: Wi-Fi circuit board; 32: heat sink; 33: Wi-Fi antenna; 34: Wi-Fi antenna; 4: gyroscope board; 51: first shaft motor; 52: second shaft arm; 53: first bearing; 54: hollow shaft; 55: first motor seat 56: first bearing seat 61: second shaft motor; 621: third shaft arm; 622: decorating component; 631: third shaft seat; 632: stuffy cover; 71: third shaft motor; 721: gimbal fixed support; 722: shock absorption ball; 723: gimbal shock absorption plate; 81: gimbal receiver; 82: fastening component; 83: gimbal main control board; 84: photoelectric encoder; 91: screw; 92: screw; 93: screw; 94: screw; 95: screw; 96: screw; 97: screw; 98: screw; 99: slip ring power wire.

DETAILED DESCRIPTION OF THE PREFERRED EMBODIMENT

The present invention is further more clearly and completely explained with accompanying preferred embodiments and drawings as follows.

As shown in FIGS. 1-5, the present invention provides a gimbal. Specifically, referring to FIGS. 3-5, the gimbal comprises a housing 1 which is capable of rotating around three axes.

Figure 1:
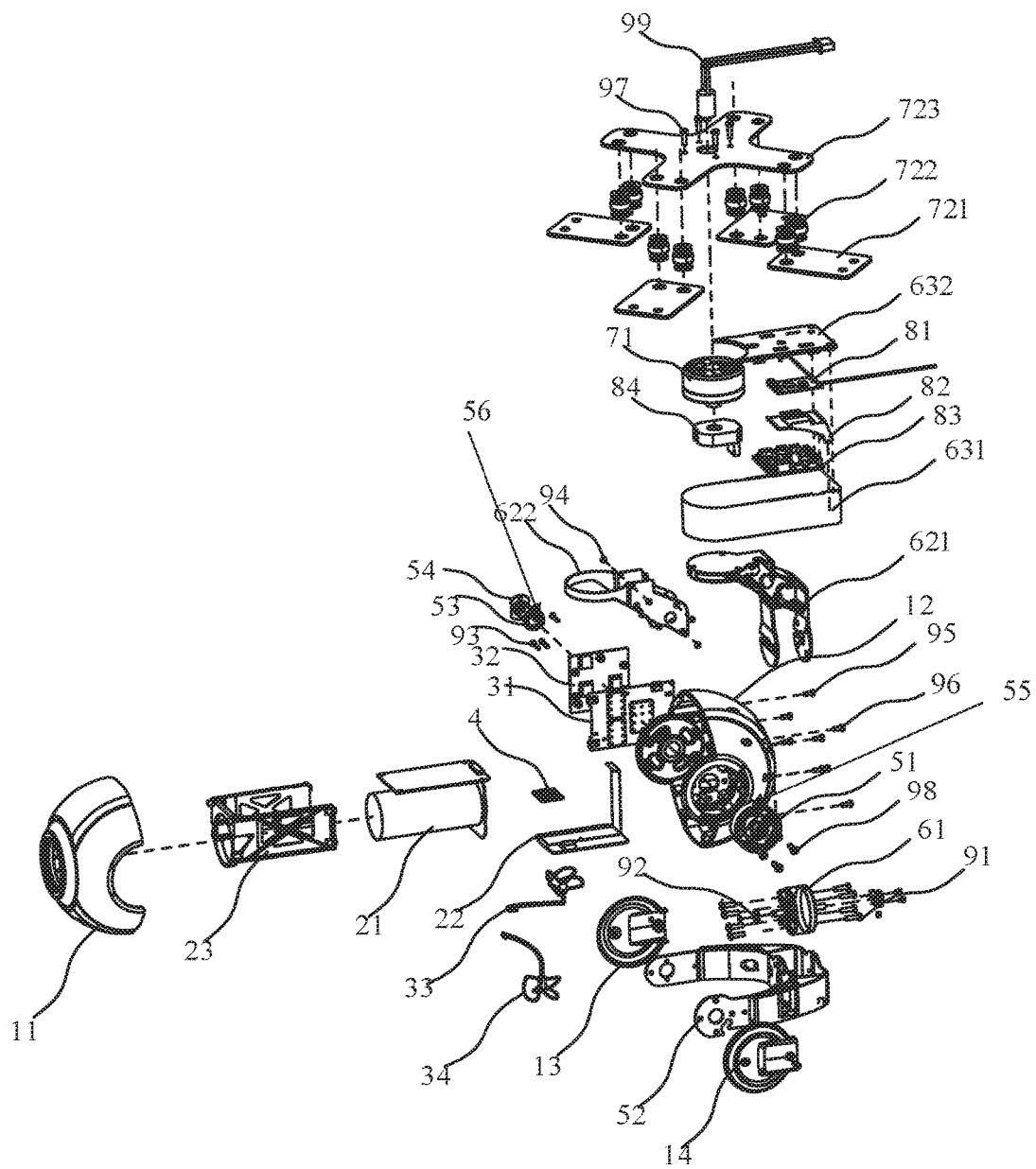
FIG. 1 is an exploded structural diagram of a gimbal according to a preferred embodiment of the present invention.
Figure 2:
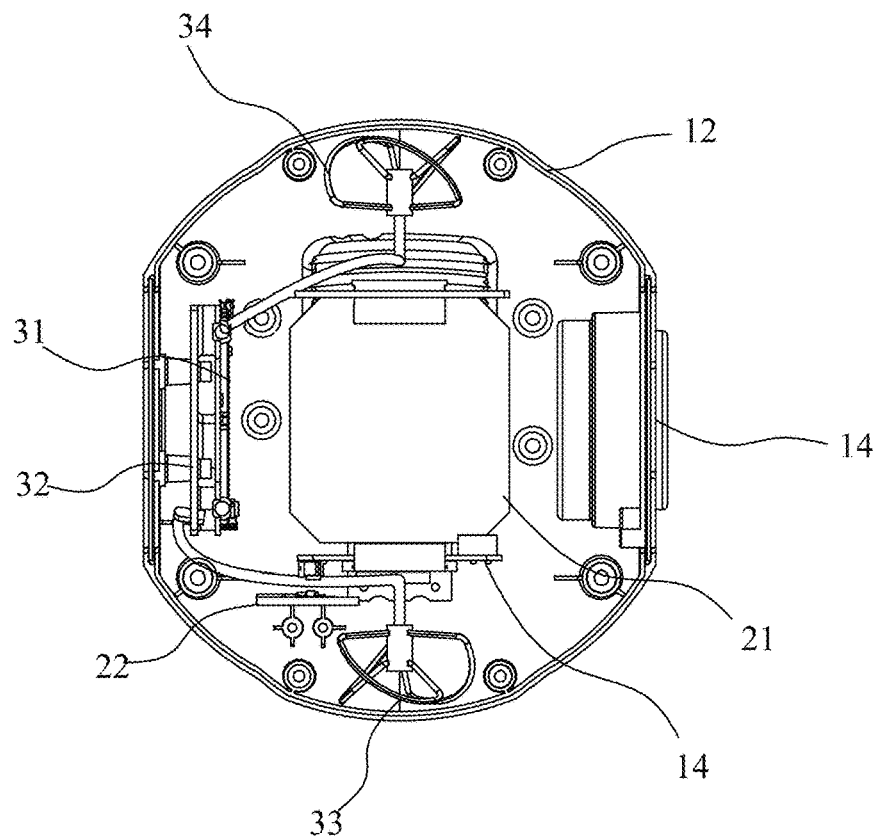
FIG. 2 is an internally structurally schematic view of a housing according to the above preferred embodiment of the present invention.
Figure 3:
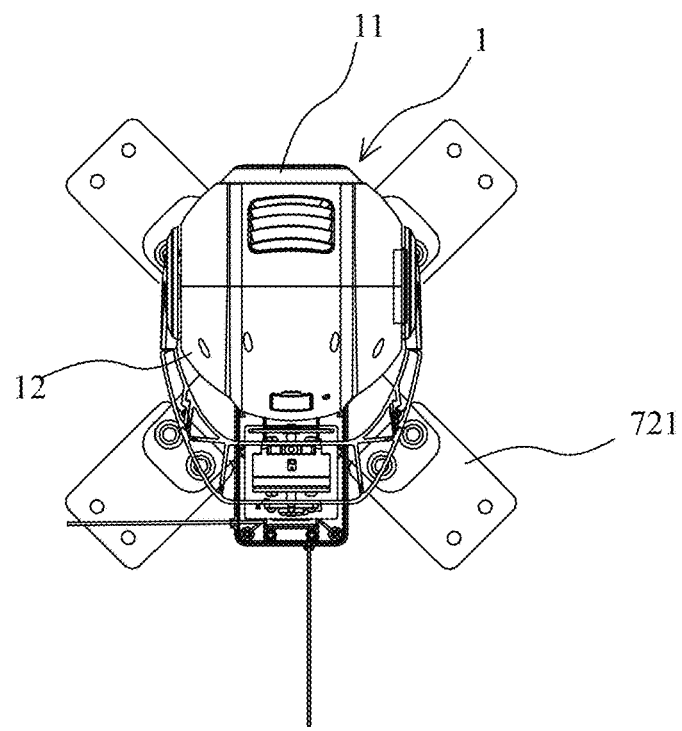
FIG. 3 is a top view of the gimbal according to the preferred embodiment of the present invention.
Figure 4:
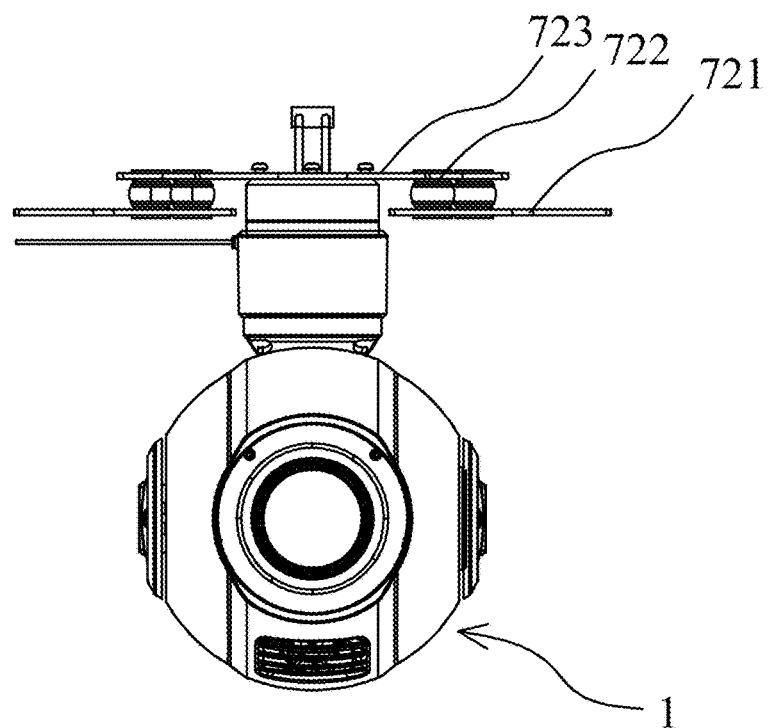
FIG. 4 is a front view of the gimbal according to the preferred embodiment of the present invention.
Figure 5:
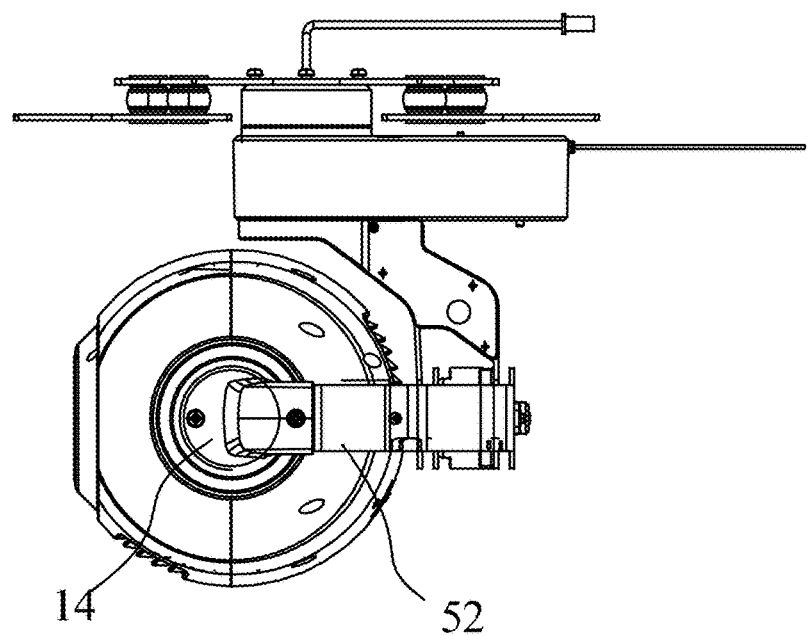
FIG. 5 is a side view of the gimbal according to the preferred embodiment of the present invention.

Referring to FIGS. 1 and 2, the housing 1 comprises a front cover 11 and a rear cover 12 connected with the front cover 11 through multiple screws 95.

A gyroscope board 4, a camera 21 and a camera main control board 22 electrically connected with the camera 21 are disposed in the housing 1. The camera 21 is installed on the camera frame 23. The camera frame 23 is connected with the rear cover 12 through multiple screws 96 for fastening.

A Wi-Fi (wireless fidelity) circuit board 31, Wi-Fi antennas 33, 34 and a heat sink 32 are also disposed in the housing 1, wherein: the Wi-Fi circuit board 31 is electrically connected with the camera main control board 22; the heat sink 32 is attached to the Wi-Fi circuit board 31 for effectively dissipating heat of the Wi-Fi circuit board 31; both the heat sink 32 and the Wi-Fi circuit board 31 are fixed to the rear cover 12 through screws 93.

While operating, the Wi-Fi circuit board is adapted for receiving video signals and transmitting the video signals to an exterior through the Wi-Fi antennas 33, 34. The Wi-Fi circuit board 31 always rotates with the housing 1, which not only saves wires for connecting the housing 1 with the exterior, but also avoids wear and tear of the wires due to rotating the housing 1.

Preferably, as shown in FIG. 2, the present invention comprises the Wi-Fi antennas 33, 34 which are respectively connected with the Wi-Fi circuit board 31 and located at a lower side and an upper side of the housing 1 for enhancing the signal strength and avoiding shielding of other frame structures while rotating the housing 1, thereby ensuring the stability of signals.

As shown in FIG. 1, a second shaft arm 52 is disposed at an outside of the housing 1, a first motor seat and a first bearing seat are respectively disposed at two sides of the rear cover 12, the second shaft arm 52 is fixed to one end of a first shaft motor 51 through screws 98, the first motor seat is also fixed to the other end of the first shaft motor 51 through screws. The two ends of the first shaft motor 51 are able to produce relatively rotational movements. A first bearing 53 is fixed to the first bearing seat. A hollow shaft 54 penetrates through the first bearing 53.

The second shaft arm 52 is respectively connected with the hollow shaft 54 and the first shaft motor 51, and the two ends of the first shaft motor 51 are able to produce relatively rotational movements, such that the housing 1 is able to rotate relatively to the second shaft arm 52 for adjusting camera angles.

Preferably, the first motor seat and the first bearing seat are respectively covered with end caps 13, 14 for sealing the housing 1, so as to avoid components in the housing being eroded.

The gimbal provided by the present invention further comprises a second shaft motor 61 which is respectively fixed to the second shaft arm 52 through screws 92 and connected with a third shaft arm 621 through screws 91, two ends of the second shaft motor 61 are able to produce relatively rotational movements, such that the second shaft arm 52 is able to rotate relatively to the third shaft arm 621, for further driving the housing 1 to rotate.

The gimbal further comprises a third shaft seat 631, and the third shaft arm 621 is fixed to the third shaft seat 631. A gimbal receiver 81, a photoelectric encoder 84 and a gimbal main control board 83 are disposed in the third shaft seat 631. The gimbal main control board 83 is fixed to the third shaft seat 631 through a fastening component 82. The third shaft seat 631 is covered with a stuffy cover 632 for sealing the third shaft seat 631, so as to ensure the sealing effect.

The gimbal further comprises a third shaft motor 71, one end of which is connected with the third shaft seat 631 and the other end thereof is connected with a gimbal shock absorption plate 723 through screws 97, such that the third shaft seat 631 is able to rotate relatively to the gimbal shock absorption plate 723, so as to further drive the housing 1 to rotate.

The gimbal further comprises four gimbal fixed supports 721, wherein multiples hock absorption balls 722 are disposed between the gimbal shock absorption plate 723 and each of the gimbal fixed supports 721 for reducing the vibration of the gimbal, so as to ensure the image quality of the camera.

Furthermore, a slip ring power wire 99 is disposed on the gimbal shock absorption plate 723 for supplying power. A decorating component 622 is connected with an outside of the third shaft arm 621 through screws 94 for ensuring aesthetics.

While the specific embodiments of the present invention have been described above, it should be understood by one skilled in the art that these embodiments are merely illustrative and that various changes or modifications may be made to these embodiments without departing from the principles and spirit of the present invention. Accordingly, the protective scope of the present invention is limited by the appended claims.

What is claimed is:

1. A gimbal, comprising a housing, wherein: a gyroscope board, a camera and a camera main control board electrically connected with the camera are disposed in the housing; a Wi-Fi (wireless fidelity) circuit board and Wi-Fi antennas are disposed in the housing; the Wi-Fi circuit board is electrically connected with the camera main control board, the camera is fixed on the housing.

2. The gimbal, as recited in claim 1, wherein the camera is fixed in the housing through a camera frame.

3. The gimbal, as recited in claim 1, wherein an amount of the Wi-Fi antennas is two; the two Wi-Fi antennas are respectively located at an upper side and a lower side of the housing.

4. The gimbal, as recited in claim 1, wherein a heat sink is disposed in the housing and is attached to the Wi-Fi circuit board.

5. The gimbal, as recited in claim 2, wherein a heat sink is disposed in the housing and is attached to the Wi-Fi circuit board.

6. The gimbal, as recited in claim 3, wherein a heat sink is disposed in the housing and is attached to the Wi-Fi circuit board.

7. The gimbal, as recited in claim 5, wherein the housing comprises a front cover and a rear cover connected with the front cover through threaded components.

8. The gimbal, as recited in claim 6, wherein the housing comprises a front cover and a rear cover connected with the front cover through threaded components.

9. The gimbal, as recited in claim 7, further comprising a second shaft arm, wherein a first motor seat and a first bearing seat are respectively disposed at two sides of the rear cover, a first shaft motor is fixed to the first motor seat, a first bearing is fixed to the first bearing seat, a hollow shaft penetrates through the first bearing, the second shaft arm is respectively connected with the hollow shaft and the first shaft motor.

10. The gimbal, as recited in claim 8, further comprising a second shaft arm, wherein a first motor seat and a first bearing seat are respectively disposed at two sides of the rear cover, a first shaft motor is fixed to the first motor seat, a first bearing is fixed to the first bearing seat, a hollow shaft penetrates through the first bearing, the second shaft arm is respectively connected with the hollow shaft and the first shaft motor.

11. The gimbal, as recited in claim 9, wherein the first motor seat and the first bearing seat are respectively covered with two end caps.

12. The gimbal, as recited in claim 10, wherein the first motor seat and the first bearing seat are respectively covered with two end caps.

13. The gimbal, as recited in claim 11, further comprising a second shaft motor which is respectively connected with the second shaft arm and a third shaft arm.

14. The gimbal, as recited in claim 12, further comprising a second shaft motor which is respectively connected with the second shaft arm and a third shaft arm.

15. The gimbal, as recited in claim 13, further comprising a third shaft seat, wherein the third shaft arm is fixed to the third shaft seat.

16. The gimbal, as recited in claim 14, further comprising a third shaft seat, wherein the third shaft arm is fixed to the third shaft seat.

17. The gimbal, as recited in claim 15, further comprising a third shaft motor which is respectively connected with the third shaft seat and a gimbal shock absorption plate.

18. The gimbal, as recited in claim 16, further comprising a third shaft motor which is respectively connected with the third shaft seat and a gimbal shock absorption plate.

19. The gimbal, as recited in claim 18, further comprising gimbal fixed supports, wherein multiple shock absorption balls are disposed between the gimbal shock absorption plate and each of the gimbal fixed supports.

20. The gimbal, as recited in claim 19, wherein a gimbal receiver, a photoelectric encoder and a gimbal main control board are disposed in the third shaft seat, the third shaft seat is covered with a stuffy cover.

* * * * *